(12) United States Patent
Lung

(10) Patent No.: US 8,679,917 B2
(45) Date of Patent: Mar. 25, 2014

(54) BURIED BIT LINE ANTI-FUSE ONE-TIME-PROGRAMMABLE NONVOLATILE MEMORY

(71) Applicant: Macronix International Co., Ltd., Hsinchu (TW)

(72) Inventor: Hsiang-Lan Lung, Ardsley, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/925,419

(22) Filed: Jun. 24, 2013

(65) Prior Publication Data

US 2013/0286709 A1     Oct. 31, 2013

Related U.S. Application Data

(60) Division of application No. 12/841,969, filed on Jul. 22, 2010, now Pat. No. 8,476,157, which is a continuation of application No. 12/557,262, filed on Sep. 10, 2009, now Pat. No. 7,786,000, which is a division of application No. 11/123,589, filed on May 6, 2005, now Pat. No. 7,638,855.

(51) Int. Cl.
*H01L 21/336* (2006.01)

(52) U.S. Cl.
USPC ........................................................ 438/260

(58) Field of Classification Search
USPC .......... 438/257, 260, 514, 527, 600; 257/316, 257/350
See application file for complete search history.

(56) References Cited

U.S. PATENT DOCUMENTS

| 4,543,594 A | 9/1985 | Mohsen et al. |
| 4,651,409 A | 3/1987 | Ellsworth et al. |
| 4,876,220 A | 10/1989 | Mohsen et al. |
| 4,881,114 A | 11/1989 | Mohsen et al. |
| 4,922,319 A | 5/1990 | Fukushima |
| 5,441,907 A | 8/1995 | Sung et al. |
| 5,640,344 A | 6/1997 | Pani et al. |
| 5,656,534 A | 8/1997 | Chen et al. |
| 6,034,882 A | 3/2000 | Johnson et al. |
| 6,103,573 A * | 8/2000 | Harari et al. .................. 438/257 |

(Continued)

OTHER PUBLICATIONS

E Hamdy et al., "Dielectric Based Antifuse for Logic and Memory ICs," IEDM Tech. Dig. (1988), pp. 786-789.

(Continued)

*Primary Examiner* — Nathan Ha
(74) *Attorney, Agent, or Firm* — Kenta Suzue; Haynes Beffel & Wolfeld LLP

(57) ABSTRACT

An anti-fuse one-time-programmable (OTP) nonvolatile memory cell has a P well substrate with two P⁻ doped regions. Another N⁺ doped region, functioning as a bit line, is positioned adjacent and between the two P⁻ doped regions on the substrate. An anti-fuse is defined over the N⁺ doped region. Two insulator regions are deposited over the two P⁻ doped regions. An impurity doped polysilicon layer is defined over the two insulator regions and the anti-fuse. A polycide layer is defined over the impurity doped polysilicon layer. The polycide layer and the polysilicon layer function as a word line. A programmed region, i.e., a link, functioning as a diode, is formed on the anti-fuse after the anti-fuse OTP nonvolatile memory cell is programmed. The array structure of anti-fuse OTP nonvolatile memory cells and methods for programming, reading, and fabricating such a cell are also disclosed.

8 Claims, 17 Drawing Sheets

(56) References Cited

U.S. PATENT DOCUMENTS

| | | | |
|---|---|---|---|
| 6,114,204 A * | 9/2000 | Ding et al. | 438/264 |
| 6,376,284 B1 | 4/2002 | Gonzalez et al. | |
| 6,611,032 B2 | 8/2003 | Schuegraf et al. | |
| 6,717,234 B2 | 4/2004 | Perner et al. | |
| 6,828,183 B1 * | 12/2004 | Sung et al. | 438/201 |
| 2002/0031887 A1 * | 3/2002 | Harshfield | 438/257 |
| 2002/0106866 A1 * | 8/2002 | Chen | 438/439 |
| 2002/0123194 A1 * | 9/2002 | Cho | 438/257 |
| 2003/0214841 A9 | 11/2003 | Scheuerlein et al. | |
| 2004/0051094 A1 * | 3/2004 | Ooishi | 257/5 |
| 2004/0053467 A1 * | 3/2004 | Hung et al. | 438/257 |
| 2004/0072391 A1 * | 4/2004 | Chen et al. | 438/134 |
| 2004/0087087 A1 * | 5/2004 | Ogura et al. | 438/257 |
| 2004/0262635 A1 | 12/2004 | Lee | |
| 2005/0104104 A1 | 5/2005 | Schultz et al. | |

OTHER PUBLICATIONS

C. de Graaf et al., "A Novel High-Density Low-Cost Diode Programmable Read Only Memory," IEDM Tech. Dig. (1996), pp. 189-192.

* cited by examiner

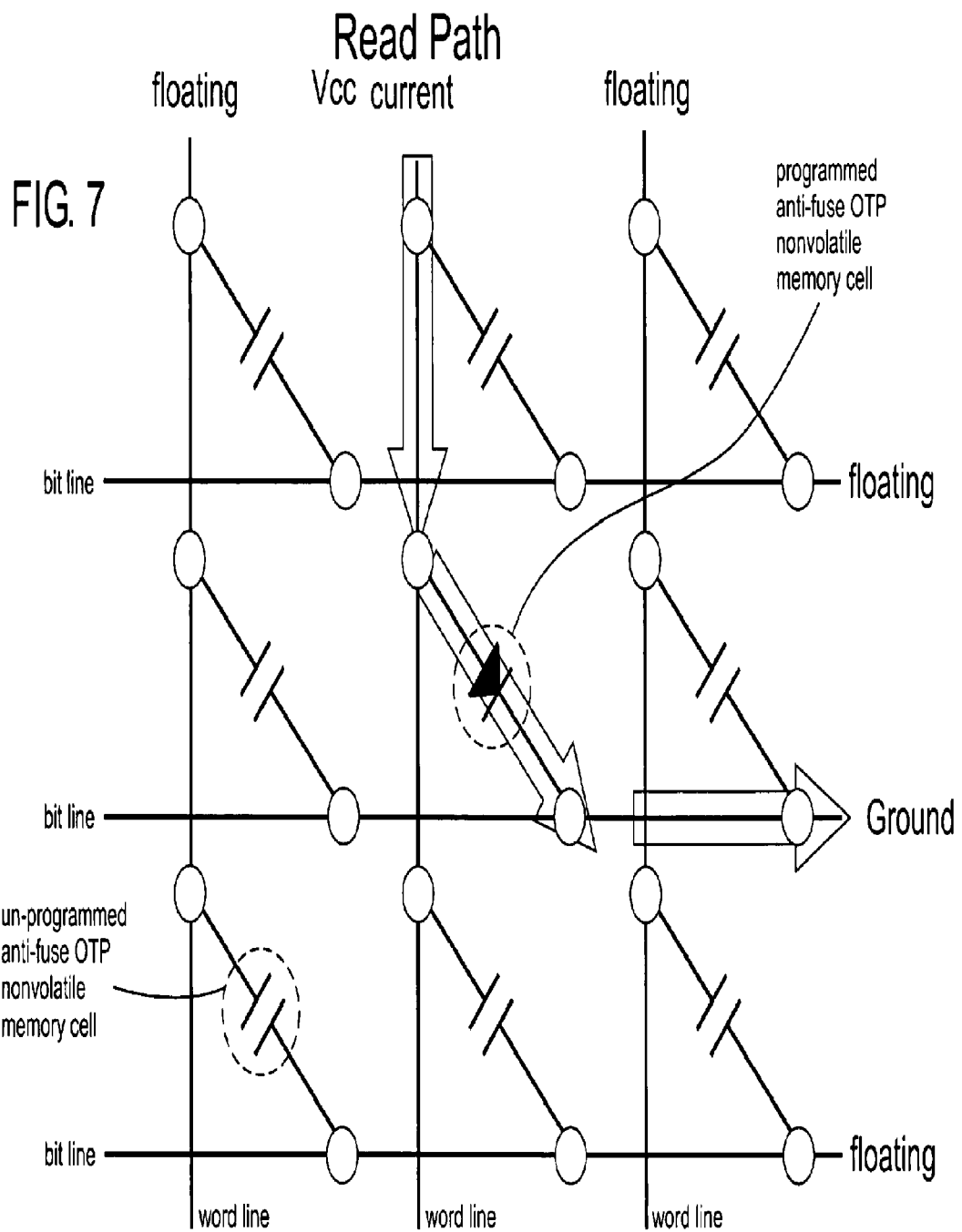

BURIED BIT LINE ANTI-FUSE ONE-TIME-PROGRAMMABLE NONVOLATILE MEMORY

CROSS-REFERENCE TO RELATED APPLICATIONS

This application is a divisional of co-pending U.S. application Ser. No. 12/841,969, filed 22 Jul. 2010; which is a continuation of U.S. application Ser. No. 12/557,262, filed Sep. 10, 2009, issued as U.S. Pat. No. 7,786,000; which is a divisional of U.S. application Ser. No. 11/123,589, filed May 6, 2005, issued as U.S. Pat. No. 7,638,855. The entire contents of all these listed matters are incorporated herein by reference.

BACKGROUND OF THE INVENTION

1. Field of the Invention

The present invention relates generally to a nonvolatile memory cell, and more particularly, to an anti-fuse one-time-programmable nonvolatile memory cell(s) and methods for fabricating, programming, and reading such a cell(s).

2. Description of Related Art

With the rapid development of consumer electronic products, solid-state data storage has become increasingly important. The small size, simple structure, and low cost of the solid-state data storage are especially desired for portable consumer products. Solid-state data storage technologies like EPROM and EEPROM have been optimized for high-speed applications, resulting in complex and expensive processes. However, for many consumer applications, low cost is more important than speed.

The prior art teaches diode programmable read only memories (DPROMs), however, the fabrication process of such DPROM cells is too complex due to the needs for deep trench isolation and silicon epitaxy layers. Therefore, the production cost of the DPROM cell is not low enough.

In view of the foregoing, there is a need for a programmable nonvolatile memory cell that will have a small size, simple structure, and low production cost.

SUMMARY OF THE INVENTION

Broadly speaking, the present invention fills this need by providing an anti-fuse one-time-programmable (OTP) nonvolatile memory cell. The array structure of this type of cells and methods for programming, reading, and fabricating such a cell are also described.

In accordance with one aspect of the present invention, an anti-fuse OTP nonvolatile memory cell is provided. This anti-fuse OTP nonvolatile memory cell includes a substrate with a first and second impurity doped regions that have a first polarity. A third impurity doped region, having an opposite polarity of the first polarity of the first and second impurity doped regions, is positioned adjacent and between the first and second impurity doped regions. An anti-fuse is defined over the third impurity doped region. A first and second insulator regions are positioned over the first and second impurity doped regions, respectively. An impurity doped polysilicon layer is defined over the first and second insulator regions and the anti-fuse. A polycide layer is defined over the impurity doped polysilicon layer. The third impurity doped region functions as a bit line, while the impurity doped polysilicon layer and the polycide layer function as a word line. The third impurity doped region (bit line) is buried in the substrate and is isolated by the first and the second impurity doped regions. The size of an anti-fuse OTP nonvolatile memory cell is about $4F^2$.

In one embodiment, the anti-fuse has a thickness of between about 10 Å to about 100 Å. In another embodiment, each of the insulator regions has a thickness of between bout 500 Å to about 3500 Å. In yet another embodiment, each of the impurity doped polysilicon layer and the polycide layer has a thickness of between about 500 Å to about 2000 Å. In yet another embodiment, the substrate is a P well substrate, the first and second impurity doped regions are $P^-$ doped regions, and the third impurity doped region is a $N^+$ doped region. Preferably, each of the insulator regions is one of oxide and nitride regions. The anti-fuse can be $SiO_2$, oxide-nitride-oxide (ONO), $Al_2O_3$, $ZrO_x$, $HfO_x$, etc., wherein x, being an integer, defines the chemical equation digit. Of course, the exemplary materials used to make anti-fuses are not intended to be exhaustive nor limit the invention to the precise materials disclosed.

In accordance with another aspect of the present invention, a method for programming an anti-fuse OTP nonvolatile memory cell is described. During the programming, a forward programming voltage bias is applied between the word line and the bit line of the anti-fuse OTP nonvolatile memory cell. Preferably, the forward programming voltage bias ranges from about 10V to about 15V. As a result, the anti-fuse of the anti-fuse OTP nonvolatile memory cell is burned out to form a programmed region (link) which functions as a diode.

In accordance with yet another aspect of the present invention, a method for reading an anti-fuse OTP nonvolatile memory cell is described. A forward reading voltage bias is applied between the word line and the bit line of the anti-fuse OTP nonvolatile memory cell. Preferably, the reading voltage bias ranges from about 1.2V to about 5V.

In accordance with yet another aspect of the present invention, a method for fabricating an anti-fuse OTP nonvolatile memory cell is described. A first impurity doped region is implanted on a provided substrate. Next, an insulator layer is deposited over the first impurity doped region. In one embodiment, the insulator layer is deposited by a chemical vapor deposition process. The middle portion of the insulator layer is then etched until the underneath first impurity doped region is exposed by an endpoint monitoring process. As a result, a trench is formed in the middle of the insulator layer. The remaining insulator layer results in two separated insulator regions. An anti-fuse is deposited at the bottom of the trench. Finally, a second impurity doped region is implanted on the portion of the first impurity doped region which lies underneath the anti-fuse. The second impurity doped region has an opposite polarity of the first impurity doped region. The second impurity doped region could be annealed by a rapid thermal anneal process after its implanting. An impurity doped polysilicon layer is deposited over the insulator regions and the anti-fuse. A polycide layer is deposited over the impurity doped polysilicon layer. Preferably, the first impurity doped region is implanted by boron, the second impurity doped region is implanted by one of arsenic and phosphorus.

The small size of the anti-fuse OTP nonvolatile memory cell and its simple cell structure result in a compact anti-fuse OTP nonvolatile memory array and low cost for its fabrication process.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 7 illustrates a schematic view of an anti-fuse OTP nonvolatile memory array during a read operation in accordance with one embodiment of the present invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
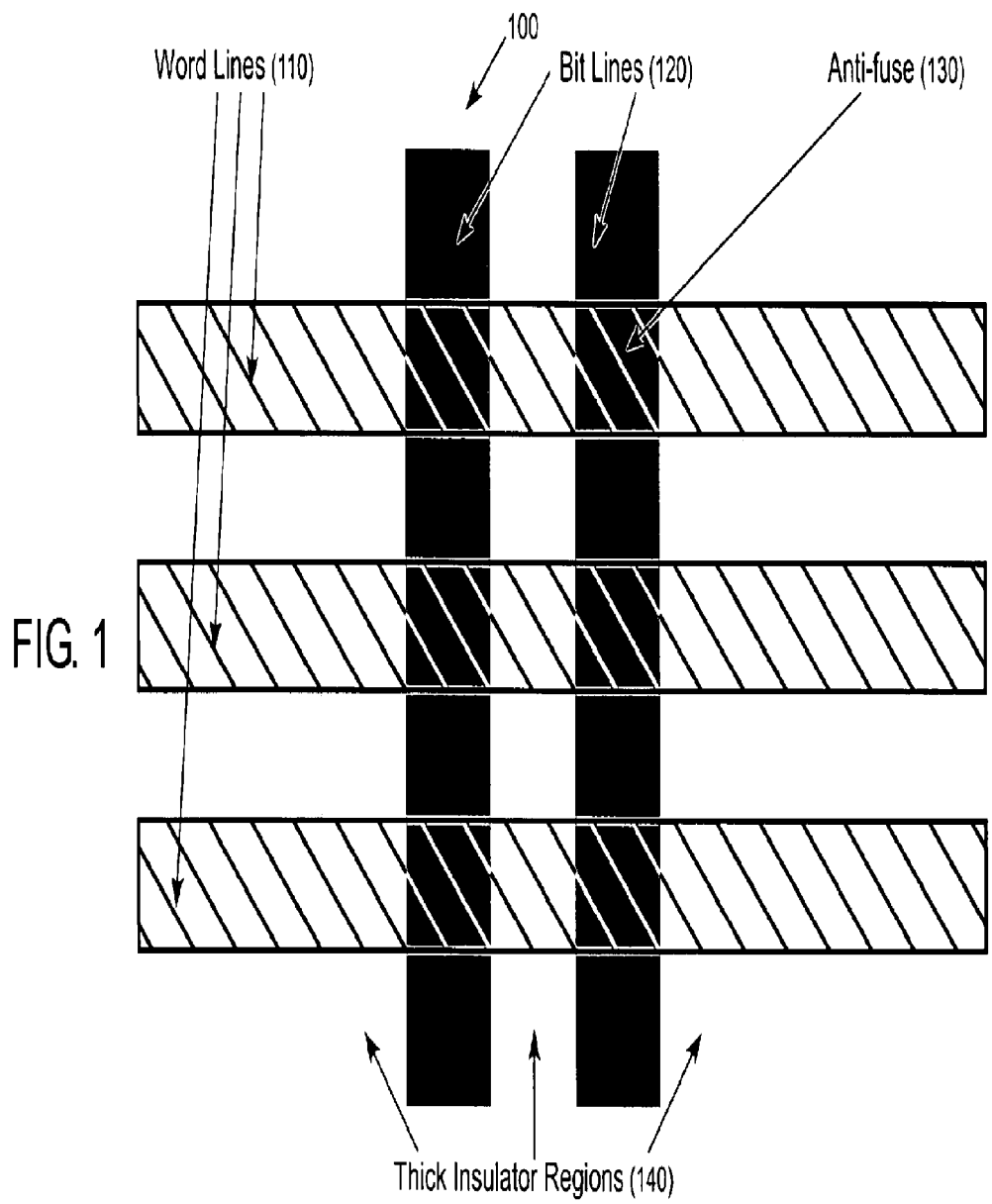
FIG. 1 illustrates a top view of an anti-fuse one-time-programmable (OTP) nonvolatile memory array in accordance with one embodiment of the present invention.

Referring initially to FIG. 1, a top view of an anti-fuse one-time-programmable (OTP) nonvolatile memory array 100 is shown in accordance with one embodiment of the present invention. The anti-fuse OTP nonvolatile memory array 100 comprises three transverse word lines 110, two vertical bit lines 120, six anti-fuses 130, and three vertical thick insulator regions 140. Preferably, the three transverse word lines 110 are defined by tungsten silicide and P-doped polysilicon, the two vertical bit lines 120 are $N^+$ implanted, and each of the thick insulator regions 140 is defined by one of oxide or nitride. The anti-fuse OTP nonvolatile memory array 100 has six anti-fuse OTP nonvolatile memory cells located at the intersections between the transverse word lines 110 and the vertical bit lines 120.

Figure 2:
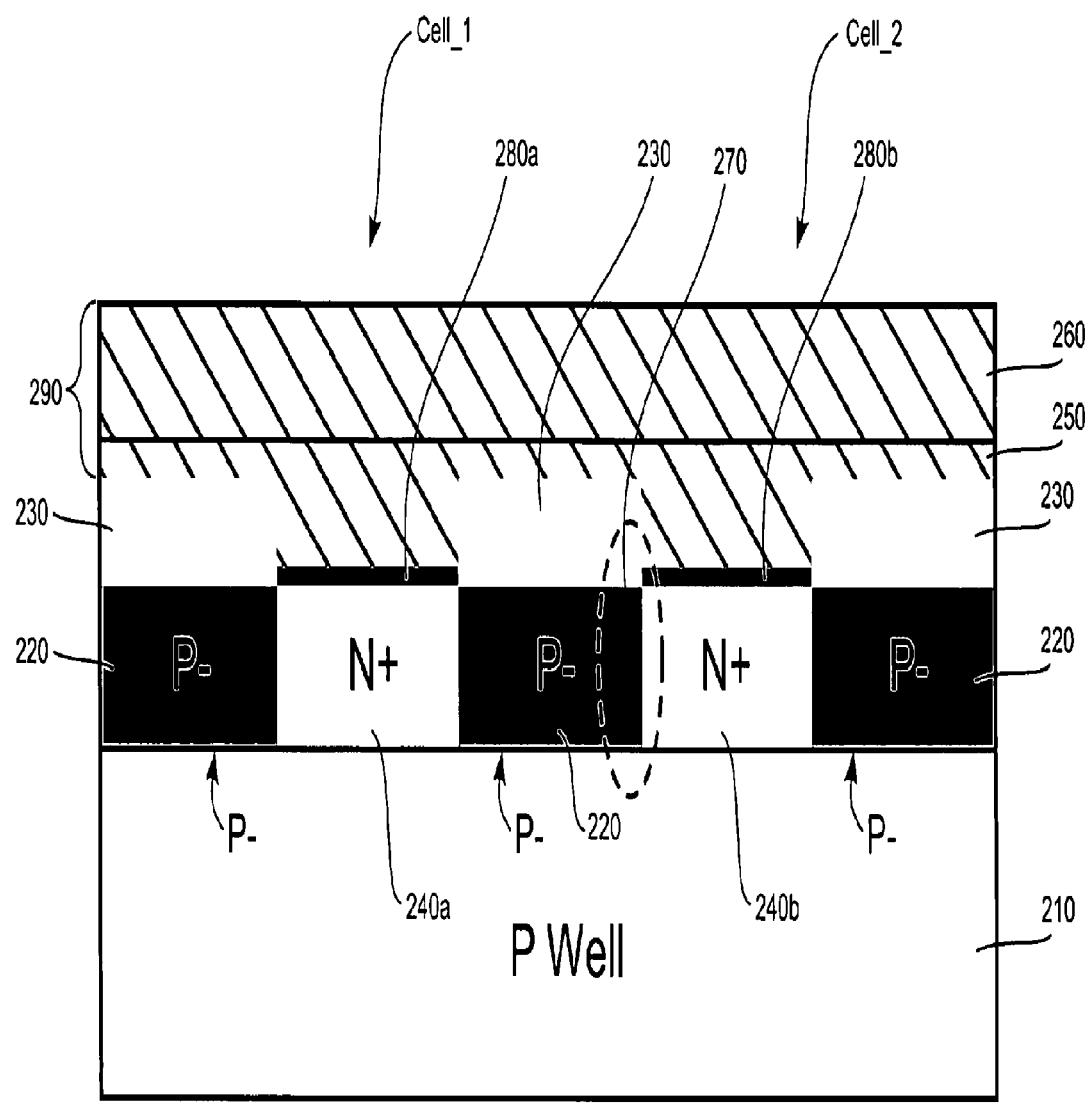
FIG. 2 illustrates a cross-sectional view of two anti-fuse OTP nonvolatile memory cells in accordance with one embodiment of the present invention.

Referring now to FIG. 2, a cross-sectional view of two anti-fuse OTP nonvolatile memory cells (cell_1 and cell_2) is shown in accordance with one embodiment of the present invention. As shown, three $P^-$ doped regions 220 are implanted on top of the P well substrate 210 in order to get better isolation performance for the $N^+$ doped regions 240a and 240b. The $N^+$ doped regions 240a and 240b, buried in the P well substrate, function as bit lines for the cell_1 and cell_2, respectively. The $N^+$ doped regions 240a and 240b (bit lines) can provide lower resistance and better scalability on bit line pitch.

Two anti-fuses 280a and 280b (i.e., shown as a material layer) are formed on top of the two $N^+$ doped regions 240a and 240b, respectively. The thickness of each of the anti-fuses 280a and 280b is preferred to be thinner than the thickness of gate oxide layers of periphery devices, which will ensure that the periphery devices can deliver a high voltage bias to anti-fuse OTP nonvolatile memory cells to enable burning of the anti-fuses during a programming operation. Burning an anti-fuse material layer during programming essentially eliminates the resistance of the anti-fuse, thus allowing electrical interconnection through a link formed at the location of the programmed burn. Three thick insulator regions 230 are formed on tops of the three P-doped regions 220. Preferably, the thick insulator regions 230 are made of oxide or nitride.

A hatched word line 290 is defined over the three thick insulator regions 230 and the two anti-fuses 280a and 280b. The hatched word line 290 includes a P-doped polysilicon layer 250 and a polycide layer 260 with the polycide layer 260 being on top of the P-doped polysilicon layer 250. The polycide layer 260 is used for reducing the resistance of the word line 290. Alternatively, the polycide layer 260 can be a tungsten silicide layer.

The cell_1 in FIG. 2 is formed by the word line 290, the anti-fuse 280a, and the bit line 240a, whereas the cell_2 is formed by the word line 290, the anti-fuse 280b, and the bit line 240b. The size of each cell is about $4F^2$.

The three thick insulator regions 230 are used to isolate the $N^+$ doped regions (bit lines) 240a and 240b and the word line 290. In one embodiment, the three thick insulator regions 230 are formed by a chemical vapor deposition (CVD) process. The lower temperature required by the CVD process greatly reduces the thermal budget during a fabrication process for anti-fuse OTP nonvolatile memory cells. As a result, the density of an anti-fuse OTP nonvolatile memory array can be increased compared to field oxide isolation.

Along the vertical contact surface between one of the $N^+$ doped regions (bit lines) 240a and 240b and one of the P-doped regions 220, an isolation $N^+$/P-substrate junction 270 will be formed. One of the areas at where an isolation $N^+$/P-substrate junction 270 is formed is highlighted by a dotted circle. The isolation $N^+$/P-substrate junctions 270 will isolate the bit lines 240a and 240b of the cell_1 and cell_2. As a result, no other isolation is needed between the cell_1 and the cell_2, which greatly reduces the process complexity and production cost of the present invention.

Figure 3:
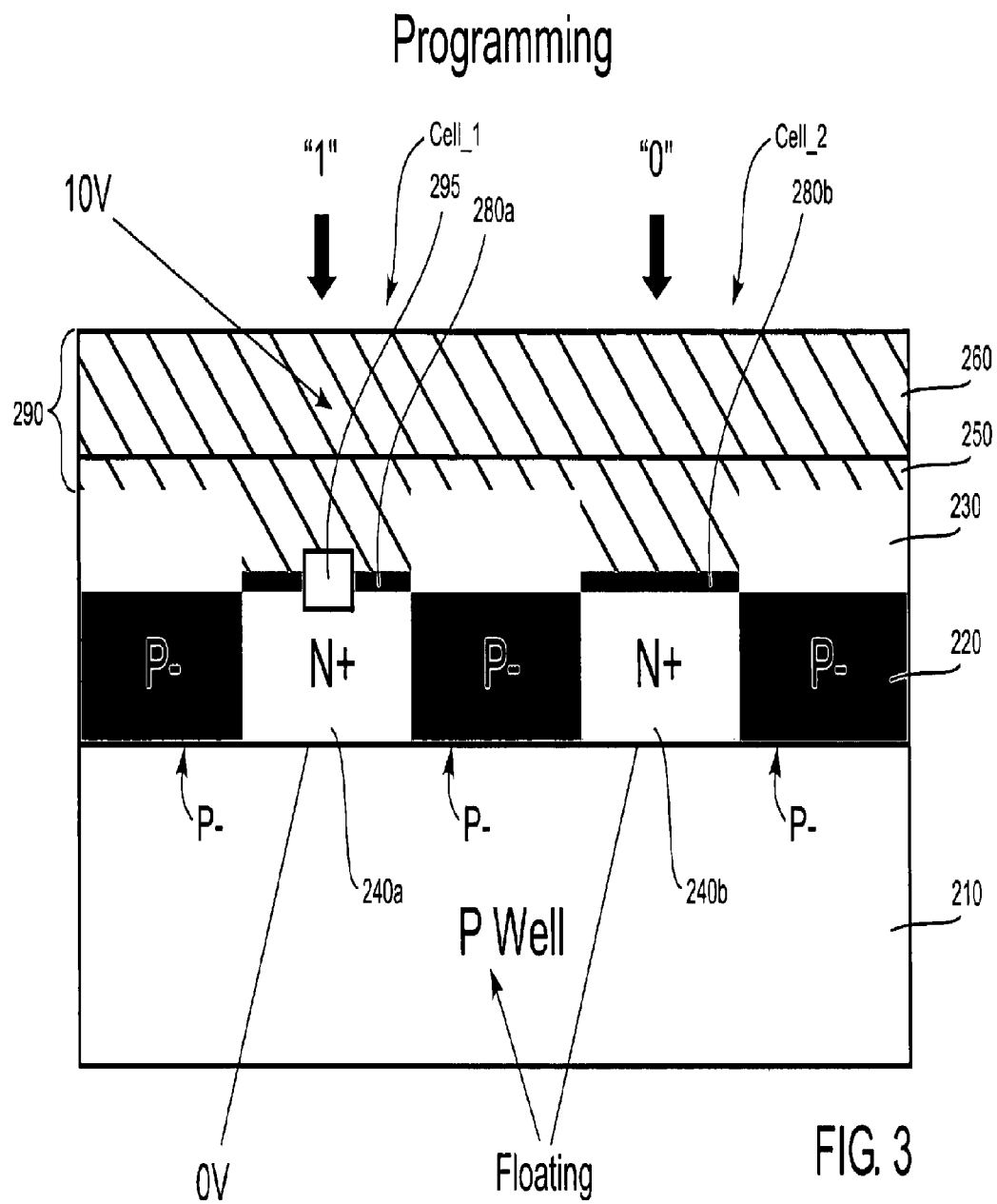
FIG. 3 illustrates an exemplary method for programming a selected anti-fuse OTP nonvolatile memory cell in accordance with one embodiment of the present invention.

Referring now to FIG. 3, an exemplary method for programming a selected anti-fuse OTP nonvolatile memory cell is shown in accordance with one embodiment of the present invention. In this embodiment, the left anti-fuse OTP nonvolatile memory cell (cell_1) is selected to be programmed. During the programming operation, a suitable programming voltage bias is applied to the selected bit line 240a and word line 290 of the cell_1 to burn out the anti-fuse 280a. In this embodiment, the P well substrate 210 and the bit line 240b of the un-selected cell_2 are floating during the programming operation. Preferably, the programming voltage applied to the word line 290 is about 10V and the bit line 240a of the cell_1 is grounded.

Due to the programming voltage bias between the word line 290 and the bit line 240a, the anti-fuse 280a of the cell_1 is burned out. As a result, a programmed region (link) 285 is formed between the word line 290 and the bit line 240a of the cell_1. During a read operation for the cell_1, the read current will flow from the word line 290 towards its bit line 240a.

Because the burned out anti-fuse 280a has lower resistance than the unburned anti-fuse 280b, the different resistance levels between the anti-fuse 280a of the cell_1 and the anti-fuse 280b of the cell_2 result that the programmed cell_1 represents the logic "1", whereas the un-programmed cell_2 represents the logic "0".

Figure 4:
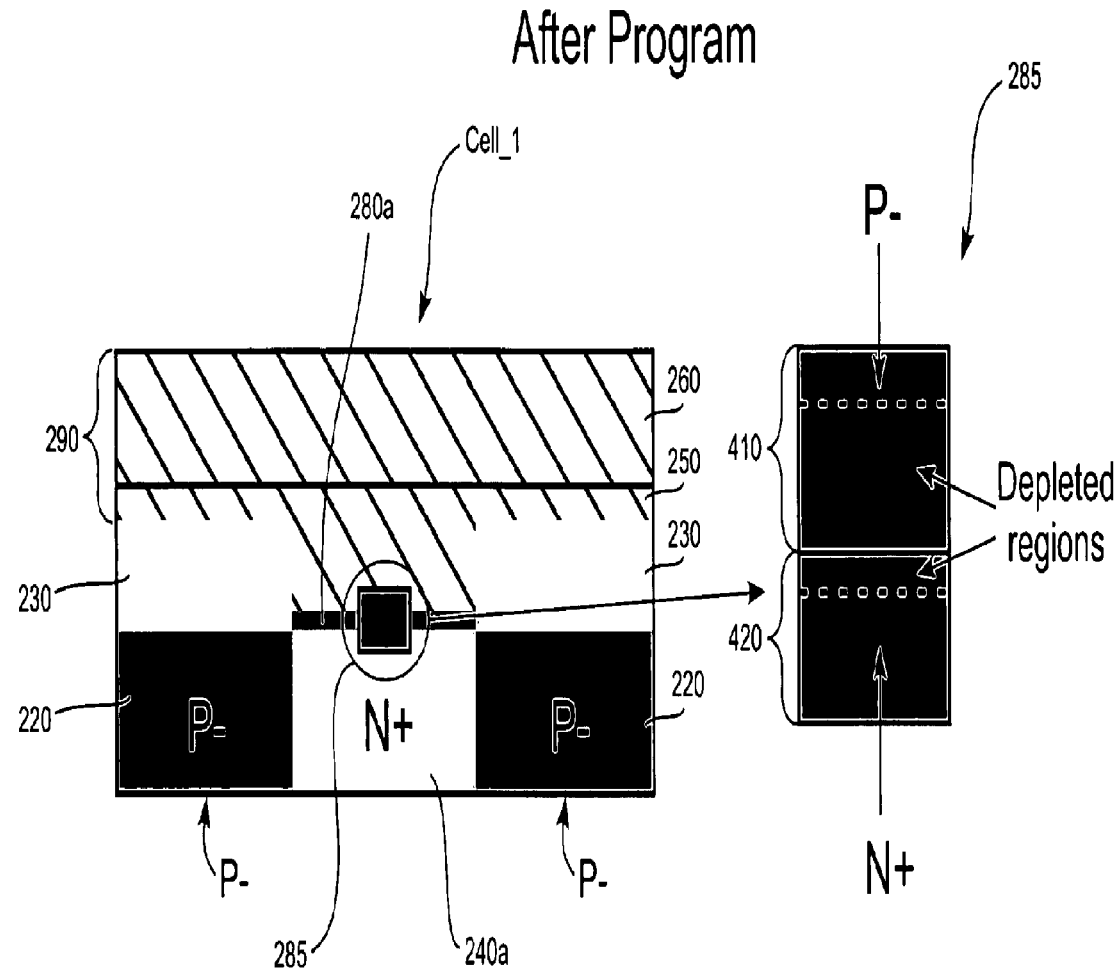
FIG. 4 illustrates cross-sectional views of a programmed anti-fuse OTP nonvolatile memory cell and its enlarged programmed region in accordance with one embodiment of the present invention.

Referring now to FIG. 4 in view of FIG. 3, cross-sectional views of the programmed anti-fuse OTP nonvolatile memory cell (cell_1 of FIG. 3) and its enlarged programmed region (link) 285 are shown in accordance with one embodiment of the present invention. The programmed cell_1 represents the logic "1". Functioning as a P-/N+ diode, the programmed region (link) 285 comprises one P-block 410 and one N+ block 420. Due to the forward programming voltage bias, the programmed region (link) has depleted regions, as shown in FIG. 4, near the contact surface between the P-block 410 and N+ block 420.

Figure 5A:
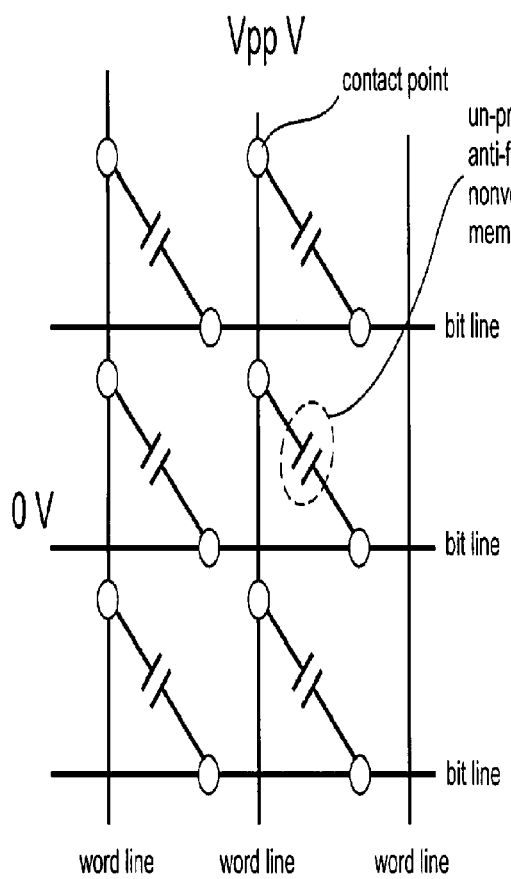
FIG. 5(a)-5(b) illustrates a schematic view of six anti-fuse OTP nonvolatile memory cells connected to bit lines and word lines during and after a programming operation in accordance with one embodiment of the present invention.
Figure 5B:
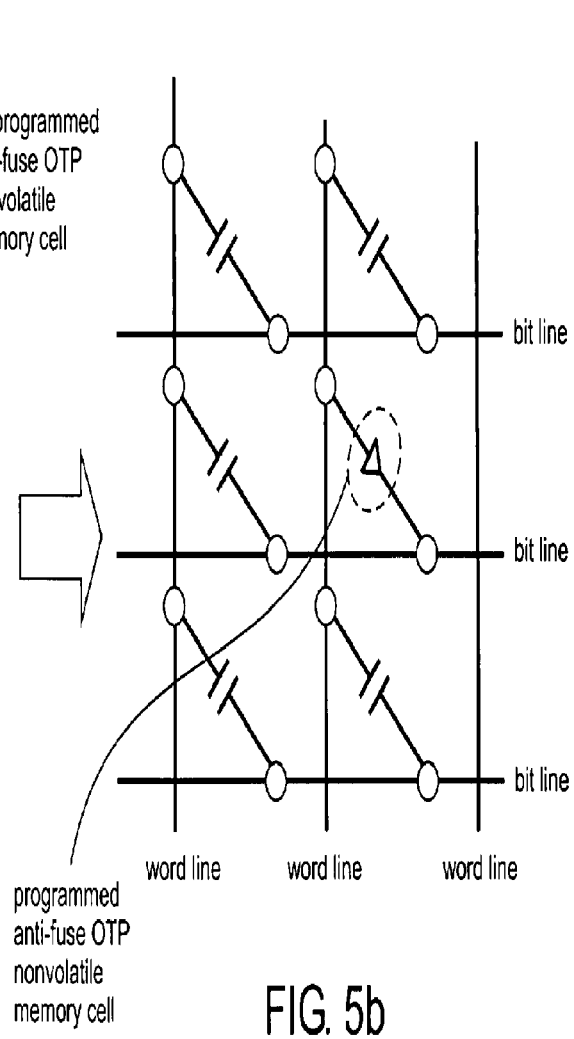

Referring now to FIG. 5(a)-(b), a schematic view of six anti-fuse OTP nonvolatile memory cells connected to three bits lines and three word lines is shown during and after a programming operation in accordance with one embodiment of the present invention. The six un-programmed anti-fuse OTP nonvolatile memory cells are assumed to have N+ doped regions as their bit lines and P-doped regions as their word lines. FIG. 5(a) shows six un-programmed anti-fuse OTP nonvolatile memory cells, each of which is connected with a transverse bit line and a vertical word line. One of the un-programmed anti-fuse OTP nonvolatile memory cells is selected to be programmed. The selected un-programmed anti-fuse OTP nonvolatile memory cell is highlighted by the dotted circle in FIG. 5(a).

During a programming operation, the word line of the selected anti-fuse OTP nonvolatile memory cell is applied with a programming voltage Vpp, while its bit line is grounded. The rest of the word lines and the bit lines in FIG. 5(a) are floating. Preferably, the programming voltage Vpp ranges from about 10V to about 15V.

During to the forward programming voltage bias (Vpp) between the word line and the bit line of the selected anti-fuse OTP nonvolatile memory cell, the anti-fuse of the selected anti-fuse OTP nonvolatile memory cell is burned out. Thus, the selected anti-fuse OTP nonvolatile memory cell is programmed (logic "1"). As a result, a programmed region (link), functioning as a P-/N+ diode, is formed for this selected anti-fuse OTP nonvolatile memory cell. After the programming operation, the programmed anti-fuse OTP nonvolatile memory cell is indicated by the dotted circle in FIG. 5(b).

Figure 6A:
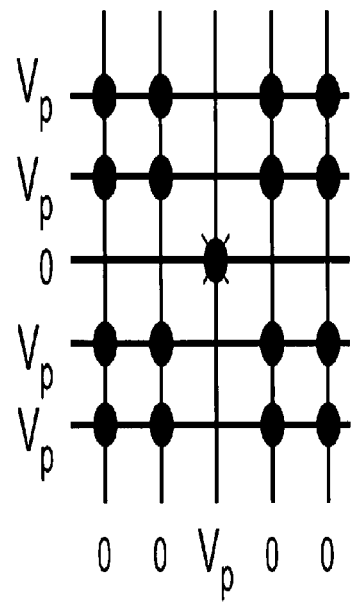
FIG. 6(a)-(c) illustrate three programming methods for an anti-fuse OTP nonvolatile memory array in accordance with one embodiment of the present invention.
Figure 6B:
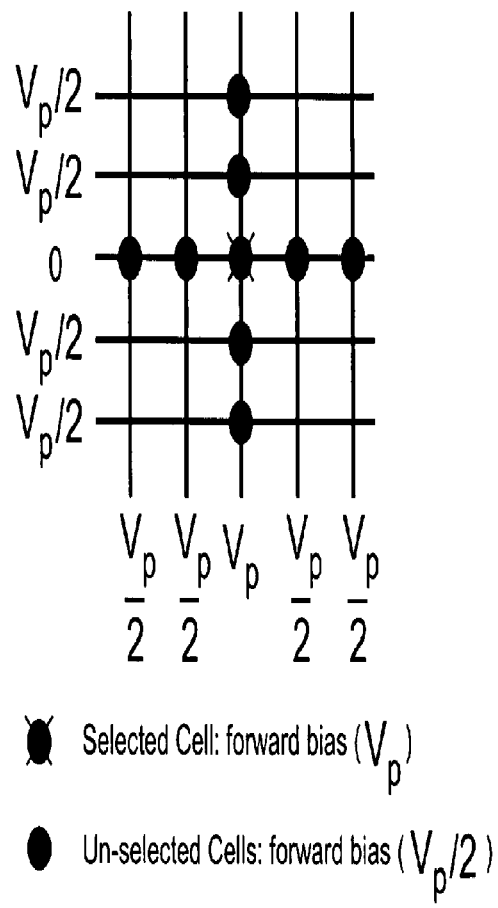
Figure 6C:
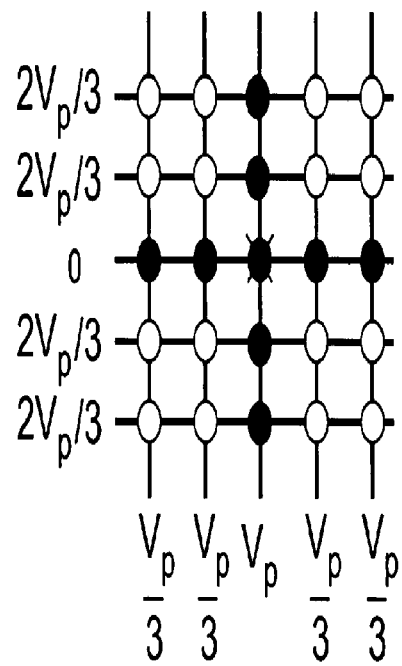

FIG. 6(a)-(c) illustrate three programming methods for anti-fuse OTP nonvolatile memory cells: the Philip's method, the V/2 method, and the V/3 method. It is assumed that each anti-fuse OTP nonvolatile memory cell has a N+ doped region as its bit line and a P-doped region as its word line. Accordingly, the vertical lines in FIG. 6(a)-(c) represent word lines, whereas the transverse lines represent the bit lines. The circular dots in FIG. 6(a)-(c) represent anti-fuse OTP nonvolatile memory cells. The selected cell means that an anti-fuse OTP nonvolatile memory cell is selected to be programmed (logic "1"), while the un-selected cells mean that the logic states of those un-selected anti-fuse OTP nonvolatile memory cells will remain unchanged.

By using the Philip's method, shown in FIG. 6(a), the selected cell is given a forward bias (Vp), while the unselected cells are given a reverse bias (-Vp). As indicated in FIG. 6(b), the V/2 method is implemented by applying a full forward bias (Vp) to the selected cell and a reduced forward bias (Vp/2) to the un-selected cells. FIG. 6(c) illustrates the V/3 method by which the selected cell is given a forward bias (Vp), while the un-selected cells are given either a reduced forward bias (Vp/3) or a reverse bias (-Vp/3). The reduced forward bias (Vp/2) used in the V/2 method and the reduced forward bias (Vp/3) used in the V/3 method are not high enough to burn out the anti-fuses in the un-selected anti-fuse OTP nonvolatile memory cells. Preferably, the value of the Vp ranges from about 10V to about 15V.

By using any of the three programming methods demonstrated in FIG. 6(a)-(c), only the cells which are given a full forward bias (Vp) will be selected and programmed to "1", while the other un-selected cells are not disturbed.

The forward and reverse biases are relative to the polarities of the bit line and word line of an anti-fuse OTP nonvolatile memory cell. If the selected anti-fuse OTP nonvolatile memory cell has a P-doped region as its bit line and a N+ doped region as its word line, in order to have a forward bias, the bit line of the selected anti-fuse OTP nonvolatile memory cell will be applied with a programming voltage Vpp, while its word line is grounded.

Referring now to FIG. 7, a schematic view of an anti-fuse OTP nonvolatile memory array is shown during a read operation in accordance with one embodiment of the present invention. It is assumed that each anti-fuse OTP nonvolatile memory cell in FIG. 7 has a N+ doped region as its bit line and a P-doped region as its word line. Hence, the vertical lines in FIG. 7 represent word lines while the transverse lines represent bit lines. As shown in FIG. 7, the anti-fuse OTP nonvolatile memory array has only one programmed anti-fuse OTP nonvolatile memory cell (logic "1"), which is represented by a diode symbol. The rest of the anti-fuse OTP nonvolatile memory cells are un-programmed (logic "0"). When reading this programmed anti-fuse OTP nonvolatile memory cell, a read voltage Vcc is applied to its word line and its bit line is grounded. The rest of bit lines and word lines are floating. Arrows in FIG. 7 show the flow of the read current for this programmed anti-fuse OTP nonvolatile memory cell. Preferably, the read voltage Vcc ranges from about 1.2V to about 5V.

Figure 8:
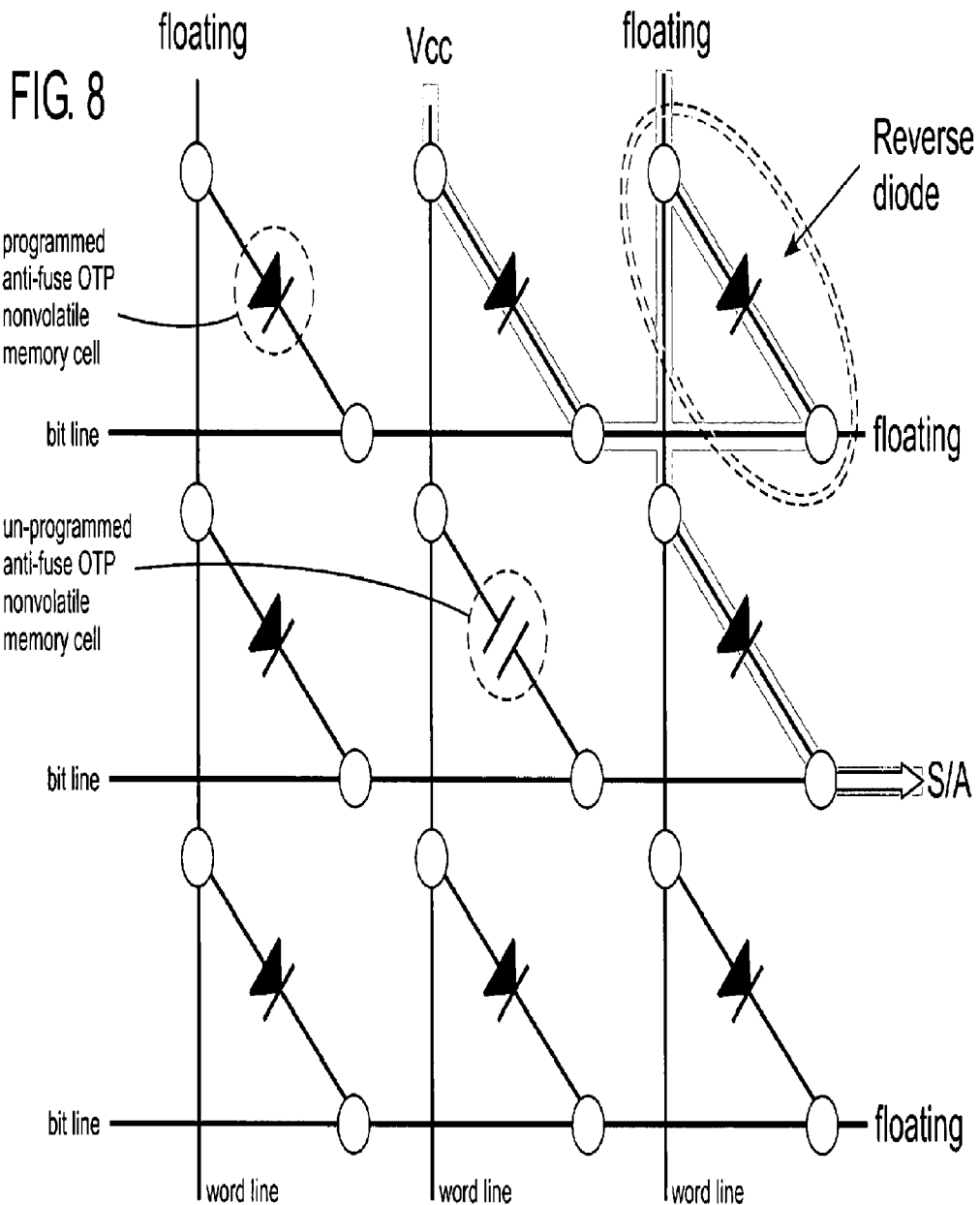
FIG. 8 illustrates a schematic view of an anti-fuse OTP nonvolatile memory array demonstrating how the present invention prevents read leakage current while reading a unprogrammed anti-fuse OTP nonvolatile memory cell in accordance with one embodiment of the present invention.

Referring now to FIG. 8, a schematic view of an anti-fuse OTP nonvolatile memory array is shown to demonstrate how the present invention prevent read leakage current during a read operation in accordance with one embodiment of the present invention. It is assumed that each anti-fuse OTP nonvolatile memory cell in FIG. 8 has a N+ doped region as its bit line and a P-doped region as its word line. Among the nine anti-fuse OTP nonvolatile memory cells shown in FIG. 8, eight of the nine memory cells are programmed (logic "1"), while one of the memory cells is un-programmed (logic "0"). The vertical lines represent word lines, whereas the transverse lines represent bit lines. When the un-programmed memory cell is read, a read voltage Vcc is applied to its word line and its bit line is connected to a sense amplifier (S/A). The rest of word lines and bit lines are floating. Preferably, the Vcc ranges from about 1.2V to about 5V.

Because the anti-fuse OTP nonvolatile memory cell to be read is un-programmed, the anti-fuse of this un-programmed anti-fuse OTP nonvolatile memory cell is not burned out. Therefore, no read current flow should be detected by the sense amplifier connected to its bit line. Because of the programmed regions (link), functioning as P-/N+ diodes, formed in the programmed anti-fuse OTP nonvolatile memory cells in this array, the programmed region (link) of the memory cell highlighted by the double dotted circle will prevent any read leakage current from going through its programmed region (link) which functions as a reverse diode in this case. As a result, the anti-fuse OTP nonvolatile memory array can prevent leakage current during a read operation. The highlighted path shows a possible read leakage current path when memory cells other than the anti-fuse OTP nonvolatile memory cells are used in this array.

Figure 9A:
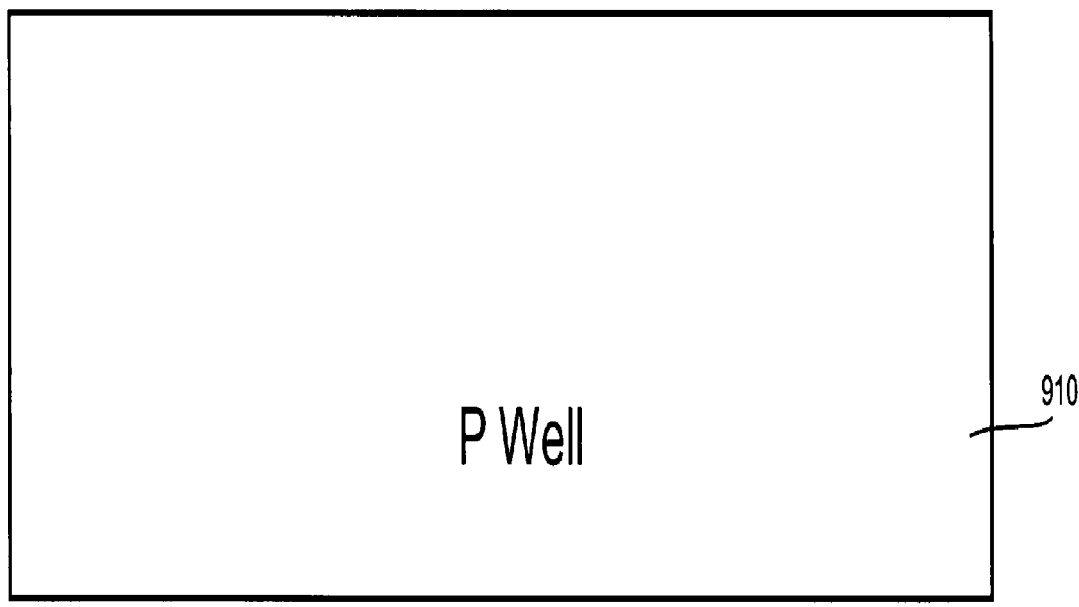
FIG. 9(a)-(g) illustrate an exemplary method for fabricating anti-fuse OTP nonvolatile memory cells in accordance with one embodiment of the present invention.
Figure 9B:
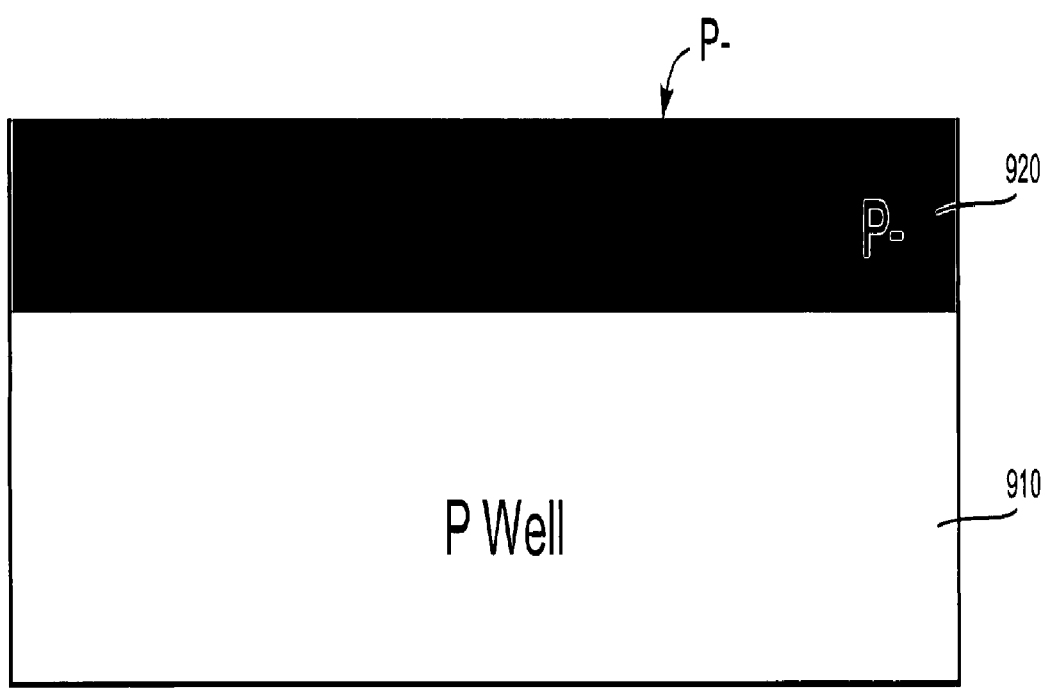
Figure 9C:
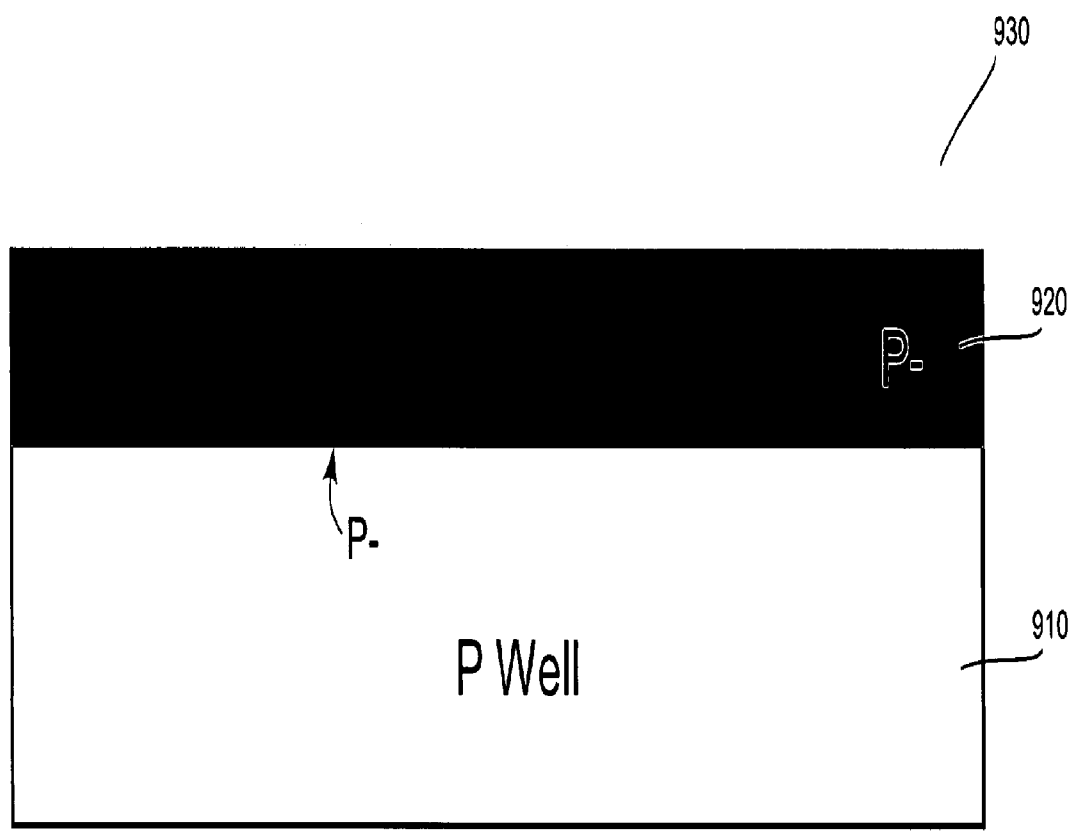

Referring now to FIG. 9(a)-(g), an exemplary method for fabricating anti-fuse OTP nonvolatile memory cells is shown in accordance with one embodiment of the present invention. First of all, a P well substrate 910 is provided in FIG. 9(a). Then, a P⁻ doped region 920 is formed on the top surface of the P well substrate 910 by ion implantation in FIG. 9(b). In one example, boron is implanted to the top surface of the P well substrate 910 to form the P⁻ doped region 920. In FIG. 9(c), a thick insulator layer 930 is deposited over the P⁻ doped region 920. In one embodiment, the thick insulator layer 930 is a thick oxide layer. In another embodiment, the thick insulator layer 930 is a nitride layer. A deposition process can be used to form the thick insulator layer 930, and the process may use a chemical vapor deposition (CVD) technique. The thickness of the thick insulator layer 930 ranges from about 500 Å to about 3500 Å. Although specific impurities have been identified, it should be understood that other impurities can be used, so long as the proper polarity is maintained.

Figure 9D:
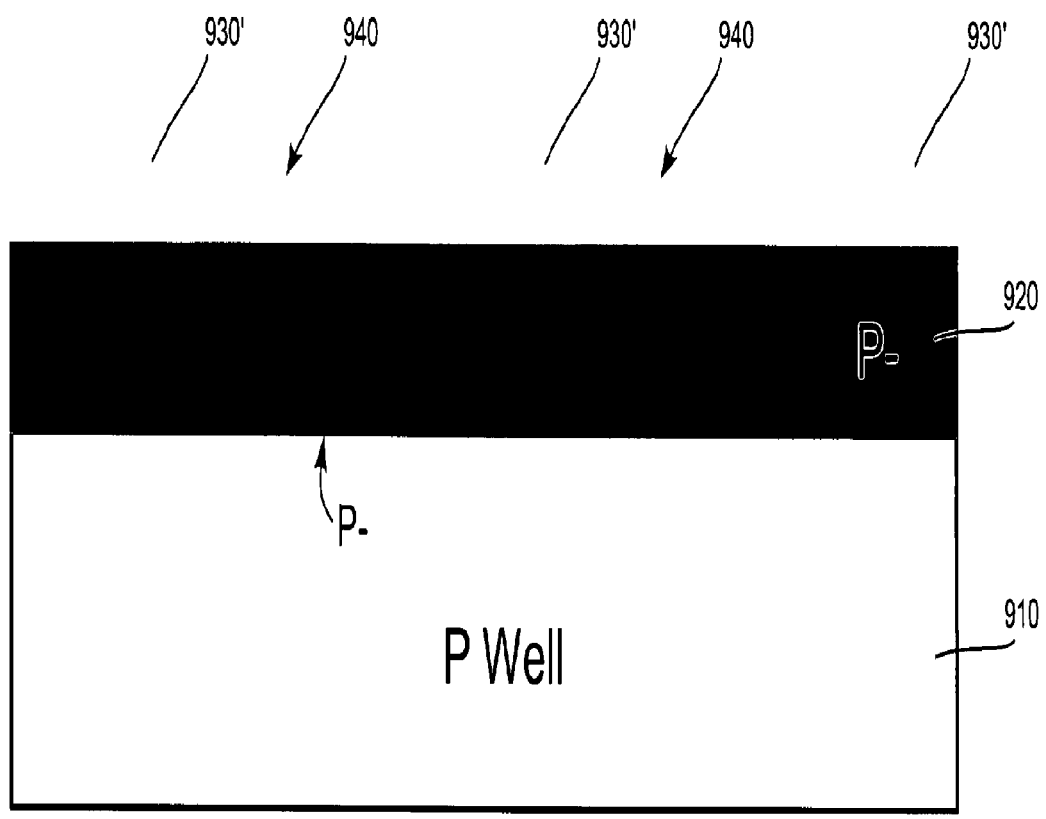
Figure 9E:
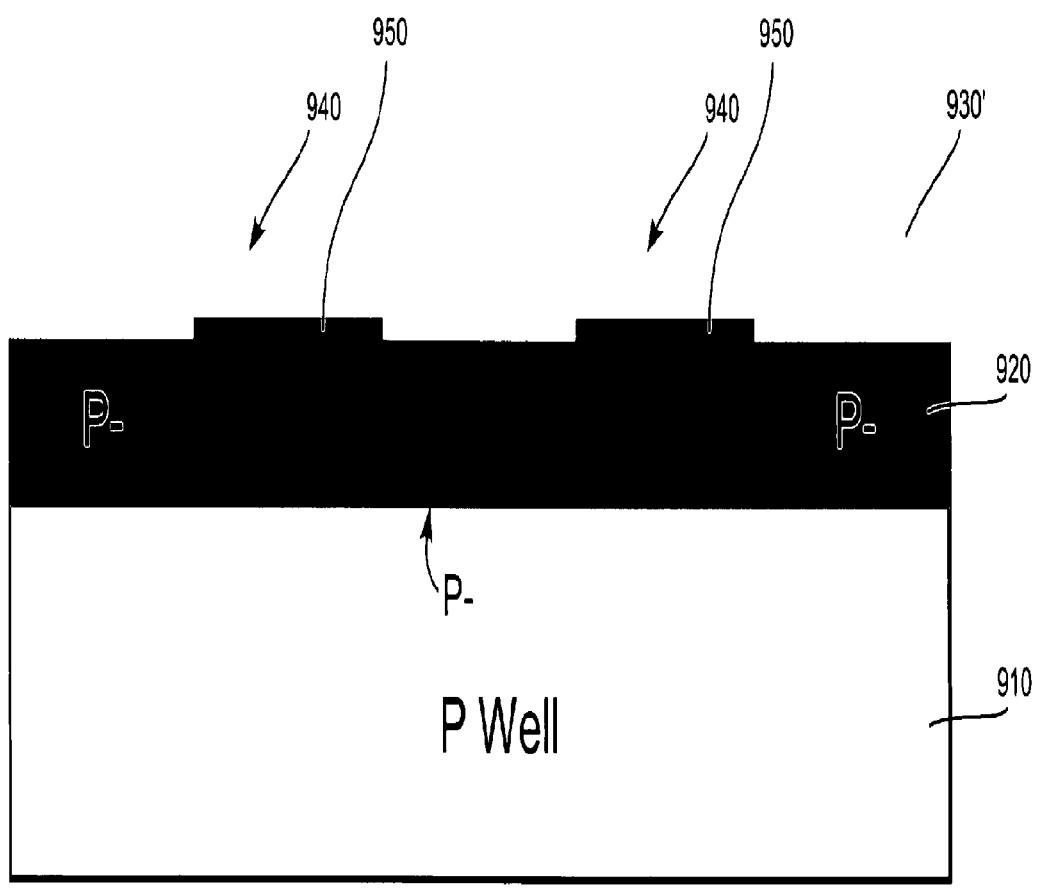

As indicated in FIG. 9(d), the thick insulator layer 930 is patterned etched until the underneath P⁻ doped region 920 is exposed. As a result, multiple trenches 940 and multiple separated thick insulator regions 930' are formed. In FIG. 9(e), multiple anti-fuses 950 are deposited at the bottoms of the multiple trenches 940. Preferably, the thickness of each of the anti-fuses 950 ranges from about 10 Å to about 100 Å. Each of the anti-fuses 950 can be $SiO_2$, oxide-nitride-oxide (ONO), $Al_2O_3$, $ZrO_x$, $HfO_x$, etc., wherein x, being an integer, defines the chemical equation digit. Of course, the exemplary materials used to make anti-fuses 950 are not intended to be exhaustive nor limit the invention to the precise materials disclosed.

Figure 9F:
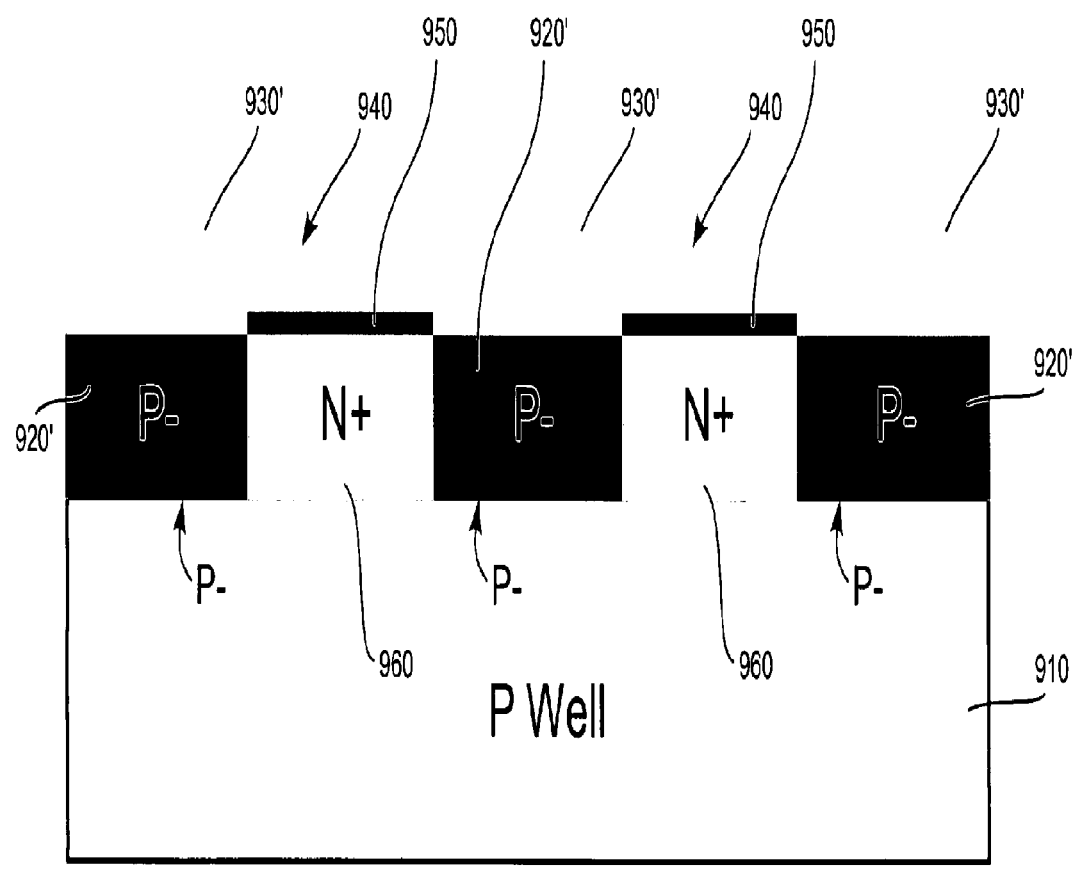
Figure 9G:
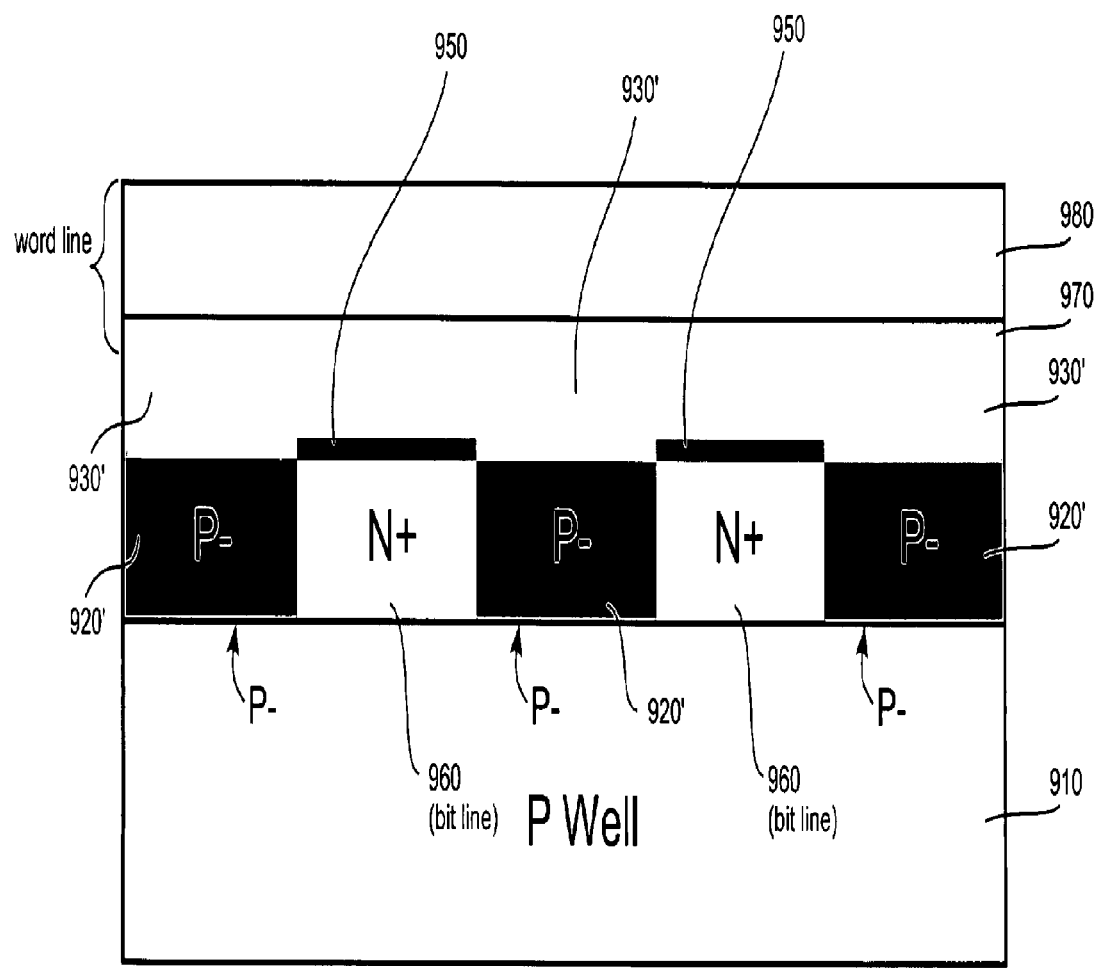

In FIG. 9(f), the portions of the P⁻ doped region 920 which lie underneath of the multiple anti-fuses 950 are ion implanted to form multiple N⁺ doped regions 960 which serves as N⁺ bit lines. The N⁺ doped regions 960 (N⁺ bit lines) are then annealed by a rapid thermal anneal (RTA) process. Preferably, arsenic (As) or phosphorus (P) can be used in the ion implantation process to form the N⁺ doped regions 960. The remaining portions of the P⁻ doped region 920 form multiple P⁻ doped regions 920' which are used to isolate the multiple N⁺ doped regions 960 (N⁺ bit lines). Finally, in FIG. 9(g), a P-doped polysilicon layer 970 is deposited over the multiple thick insulator regions 930' and the anti-fuses 950 to fill in the trenches 940. A polycide layer 980 is deposited over the P-doped polysilicon layer 970. Preferably, the thickness of each of the P-doped polysilicon layer 970 and the polycide layer 980 ranges from about 500 Å to about 2000 Å. The P-doped polysilicon layer 970 and the polycide layer 980 function as the word line. Preferably, the polycide layer 980 is a tungsten silicide (Wsi) layer.

The anti-fuse OTP nonvolatile memory cell of the present invention uses an anti-fuse to store a logic state. The anti-fuse OTP nonvolatile memory cell has a compact cell size of about $4F^2$. The bit line of an anti-fuse OTP nonvolatile memory cell is buried in the substrate and is isolated by the two adjacent impurity doped regions on the substrate. Because of its simple cell structure, the production cost for an anti-fuse OTP nonvolatile memory cell is low. The anti-fuse OTP nonvolatile memory array has high density due to the compact cell size and the simple isolation requirement between memory cells.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A method of operating a one-time-programmable nonvolatile memory cell which is part of a one-time-programmable nonvolatile memory array accessed by a plurality of word lines and a plurality of bit lines, comprising:
    programming the one-time-programmable nonvolatile memory cell, including:
        applying a program voltage between a word line of the one-time-programmable nonvolatile memory cell and a bit line of the one-time-programmable nonvolatile memory cell,
    wherein before said programming, an open circuit separates the word line of the one-time-programmable nonvolatile memory cell and the bit line of the one-time-programmable nonvolatile memory cell, and
    wherein after said programming, a diode circuit separates the word line of the one-time-programmable nonvolatile memory cell and the bit line of the one-time-programmable nonvolatile memory cell.

2. The method of claim 1, wherein the one-time-programmable nonvolatile memory cell is at an intersection of the word line of the one-time-programmable nonvolatile memory cell and the bit line of the one-time-programmable nonvolatile memory cell.

3. The method of claim 1, wherein programming the one-time-programmable nonvolatile memory cell further comprises:
    at least partly while applying the program voltage between the word line of the one-time-programmable nonvolatile memory cell and the bit line of the one-time-programmable nonvolatile memory cell, floating other bit lines of the plurality of bit lines of the one-time-programmable nonvolatile memory array and floating other word lines of the plurality of word lines of the one-time-programmable nonvolatile memory array.

4. The method of claim 1, wherein the program voltage applied between the word line of the one-time-programmable nonvolatile memory cell and the bit line of the one-time-programmable nonvolatile memory cell is a forward bias, and
    wherein programming the one-time-programmable nonvolatile memory cell further comprises:
        at least partly while applying the program voltage between the word line of the one-time-programmable nonvolatile memory cell and the bit line of the one-time-programmable nonvolatile memory cell, applying reverse bias between other bit lines of the plurality of bit lines of the one-time-programmable nonvolatile memory array and other word lines of the plurality of word lines of the one-time-programmable nonvolatile memory array.

5. A method of operating a one-time-programmable nonvolatile memory cell which is part of a one-time-programmable nonvolatile memory array accessed by a plurality of word lines and a plurality of bit lines, comprising:
- reading the one-time-programmable nonvolatile memory cell, including:
  - applying a read voltage between a word line of the one-time-programmable nonvolatile memory cell and a bit line of the one-time-programmable nonvolatile memory cell,
- wherein a first data value read from the one-time-programmable nonvolatile memory cell indicates an open circuit separating the word line of the one-time-programmable nonvolatile memory cell and the bit line of the one-time-programmable nonvolatile memory cell, and
- wherein a second data value read from the one-time-programmable nonvolatile memory cell indicates a diode circuit separating the word line of the one-time-programmable nonvolatile memory cell and the bit line of the one-time-programmable nonvolatile memory cell.

6. The method of claim 5, wherein the one-time-programmable nonvolatile memory cell is at an intersection of the word line of the one-time-programmable nonvolatile memory cell and the bit line of the one-time-programmable nonvolatile memory cell.

7. The method of claim 5, wherein reading the one-time-programmable nonvolatile memory cell further comprises:
- at least partly while applying the read voltage between the word line of the one-time-programmable nonvolatile memory cell and the bit line of the one-time-programmable nonvolatile memory cell, floating other bit lines of the plurality of bit lines of the one-time-programmable nonvolatile memory array and floating other word lines of the plurality of word lines of the one-time-programmable nonvolatile memory array.

8. The method of claim 5, wherein the read voltage applied between the word line of the one-time-programmable nonvolatile memory cell and the bit line of the one-time-programmable nonvolatile memory cell is a forward bias, and
- wherein reading the one-time-programmable nonvolatile memory cell further comprises:
  - at least partly while applying the read voltage between the word line of the one-time-programmable nonvolatile memory cell and the bit line of the one-time-programmable nonvolatile memory cell, applying reverse bias between other bit lines of the plurality of bit lines of the one-time-programmable nonvolatile memory array and other word lines of the plurality of word lines of the one-time-programmable nonvolatile memory array.

* * * * *